(12) United States Patent
Schoerner

(10) Patent No.: US 9,237,679 B2
(45) Date of Patent: Jan. 12, 2016

(54) ELECTRICAL DEVICE

(75) Inventor: Martin Schoerner, Bruchsal (DE)

(73) Assignee: SEW-EURODRIVE GMBH & CO. KG, Bruchsal (DE)

( * ) Notice: Subject to any disclaimer, the term of this patent is extended or adjusted under 35 U.S.C. 154(b) by 222 days.

(21) Appl. No.: 13/983,684

(22) PCT Filed: Jan. 16, 2012

(86) PCT No.: PCT/EP2012/000159
§ 371 (c)(1),
(2), (4) Date: Aug. 5, 2013

(87) PCT Pub. No.: WO2012/104017
PCT Pub. Date: Aug. 9, 2012

(65) Prior Publication Data
US 2013/0314876 A1    Nov. 28, 2013

(30) Foreign Application Priority Data
Feb. 4, 2011    (DE) .......................... 10 2011 010 432

(51) Int. Cl.
*H05K 7/20*    (2006.01)
*H05K 3/30*    (2006.01)
(Continued)

(52) U.S. Cl.
CPC .............. *H05K 7/2049* (2013.01); *H05K 3/30* (2013.01); *H05K 5/0221* (2013.01); *H05K 7/1432* (2013.01); *H05K 7/209* (2013.01); *H02M 7/003* (2013.01); *Y10T 29/49128* (2015.01)

(58) Field of Classification Search
CPC ......... H05K 7/20; H05K 7/1404; H05K 5/00; H05K 5/02; H05K 3/30; F28F 7/00; H01L 23/34; G06F 1/20

USPC ................ 361/679.46, 679.54, 690–694, 361/704–724; 165/80.2, 80.3, 104.33, 185; 174/15.1, 16.1, 16.3, 252; 257/706, 257/712, 713, 718, 719, 720
See application file for complete search history.

(56) References Cited

U.S. PATENT DOCUMENTS 3,735,206 A * 5/1973 Pesek ............................ 361/721
3,865,183 A * 2/1975 Roush ......................... 165/80.4
(Continued)

FOREIGN PATENT DOCUMENTS

| DE | 26 14 917 | 10/1976 |
| DE | 102 34 477 | 3/2003 |

(Continued)

OTHER PUBLICATIONS

International Preliminary Report on Patentability, dated Aug. 15, 2013, issued in corresponding International Application No. PCT/EP2012/000159.

(Continued)

*Primary Examiner* — Michail V Datskovskiy
(74) *Attorney, Agent, or Firm* — Kenyon & Kenyon LLP

(57) ABSTRACT

An electrical device includes a printed-circuit board which is fitted with heat-generating components, the printed-circuit board being disposed in a housing of the device, the housing having a housing part, particularly a cup-shaped housing part, and a cooling plate connected to the printed-circuit board being pressed by a wedge against the inner wall of the housing part, in particular, being pressed such that heat from at least one heat-generating component, especially a power module having power semiconductor switches, is able to be dissipated at a contact surface to the housing part.

12 Claims, 10 Drawing Sheets

(51) Int. Cl.
*H05K 5/02* (2006.01)
*H05K 7/14* (2006.01)
*G06F 1/20* (2006.01)
*H02M 7/00* (2006.01)

(56) References Cited

U.S. PATENT DOCUMENTS

| | | | |
|---|---|---|---|
| 4,029,999 A | | 6/1977 | Neumann et al. |
| 4,459,639 A | * | 7/1984 | Heil et al. ............... 361/720 |
| 4,475,145 A | * | 10/1984 | Heil et al. ............... 361/720 |
| 4,764,845 A | * | 8/1988 | Artus ...................... 361/705 |
| 4,867,235 A | * | 9/1989 | Grapes et al. ........... 165/185 |
| 5,060,115 A | * | 10/1991 | Sewell .................... 361/710 |
| 5,218,517 A | * | 6/1993 | Sewell .................... 361/710 |
| 5,251,099 A | * | 10/1993 | Goss et al. .............. 361/721 |
| 6,665,184 B2 | * | 12/2003 | Akselband .............. 361/699 |
| 7,633,757 B2 | * | 12/2009 | Gustine et al. .......... 361/714 |
| 8,276,655 B2 | * | 10/2012 | Chu ......................... 165/185 |
| 8,662,155 B2 | * | 3/2014 | Weinmann et al. ..... 165/185 |
| 2003/0042624 A1 | | 3/2003 | Shinohara |
| 2008/0019102 A1 | | 1/2008 | Yurko |

FOREIGN PATENT DOCUMENTS

| | | | |
|---|---|---|---|
| DE | 10 2006 022 497 | | 11/2007 |
| DE | 10 2007 041 419 | | 3/2009 |
| DE | 10 2010 050 120 | | 5/2011 |
| GB | 2 067 844 | | 7/1981 |
| WO | WO2007/128310 | * | 11/2007 ........... H05K 7/20 |

OTHER PUBLICATIONS

International Search Report, dated Jun. 19, 2012, issued in corresponding International Application No. PCT/EP2012/000159.

* cited by examiner

ELECTRICAL DEVICE

FIELD OF INVENTION

The present invention relates to an electrical device.

BACKGROUND INFORMATION

It is known that converters as electrical devices have signal electronics and power electronics. A load such as an electric motor is powered by the power electronics. The heat, especially the heat from the power semiconductor switches of the power electronics, is dissipated to a heat sink and from there to the surrounding air or another surrounding cooling medium.

To improve heat transfers, it is well-known to introduce heat-transfer compound into the heat-transfer area.

SUMMARY

Therefore, an object of the present invention is to further develop an electrical device, in doing which, production is to be simple.

Example embodiments of the device may include a printed-circuit board which is fitted with heat-generating components, the printed-circuit board being disposed in a housing of the device, the housing having a housing part, particularly a cup-shaped housing part, a cooling plate connected to the printed-circuit board being pressed against the inner wall of the housing part by a wedge, in particular, being pressed such that heat from at least one heat-generating component, especially a power module having power semiconductor switches, is able to be dissipated at a contact surface to the housing part.

This may be advantageous in that a simple but efficient connecting technique is used between the cooling plate and the housing part. Thus, good heat transfer is able to be brought about and heat-transfer compound may even be omitted. It is possible to compensate for manufacturing tolerances in easy and simple fashion. A bracing is practicable without displacement, since this would not be achievable owing to manufacturing tolerances. The wedge and associated screw may be preassembled in the cartridge made of the printed-circuit board and cooling plate, prior to joining the cartridge to the cup-shaped housing part.

In addition, environmental protection may be improved, since only the cartridge may need to be replaced in the event of defective electronics. The cup-shaped housing part is reusable and may remain installed in the system when exchanging the cartridge. This also may reduce repair expenditures.

The wedge may be supported against a section of the housing part, particularly against a housing-part section extending into the interior area of the device surrounded by the housing part. An advantage here is that bracing of the cooling plate may be achievable by the wedge by support against the section and pressing the cooling plate against the housing part.

The section may be a fastening dome. This has an advantage that the housing part may easily be manufactured in one piece together with the section. Alternatively, a two-piece construction is also feasible if the pieces are suitably joined.

A screw may be able to be screwed into an opening, especially a tapped hole, of the section such that upon being screwed in, the screw, especially its screw head, presses on the wedge and thus a pressure force is directed onto the cooling plate via an inclined surface of the wedge, especially a surface having an angle between 0° and 90° relative to the screw axis direction. This offers an advantage that manufacturing tolerances may easily be offset and the cooling plate may be able to be pressed with great force against the inner wall of the housing part.

The section may have a guideway for the wedge, in particular, the guideway having at least one guide groove which is aligned parallel to the screw axis direction. An advantage in this context is that the wedge may be able to be guided in the screw axis direction and the pressure force may be easily derivable via an inclined surface.

The wedge may have an opening, especially a round hole or a round bore, through which the screw protrudes. An advantage here is that the diameter of the opening may be smaller than the outside diameter of the screw head but greater than the diameter of the screw thread. Thus, the screw head may be usable as pressure element.

Two such wedges may be provided on the printed-circuit board, and thus a stable connection is achievable between the cartridge and the housing part.

A plastic member may at least partially surround the printed-circuit board and may be joined, especially with material-locking and/or form-locking, to the loaded printed-circuit board. This is advantageous because the printed-circuit board, together with the mounted components, may be protected from mechanical effects such as impulses, jolts or the like. In particular, components which stick out may also be stabilized better against vibrations with the aid of the plastic member.

Consequently, safe transportability and storability may be able to be ensured, the printed-circuit board not being built into the housing of the device. If the plastic member is heat-conducting, heat dissipation from the components generating heat may be improved, as well.

Alternatively, a plastic member may be disposed on both sides of the printed-circuit board and may be joined, especially with material-locking and/or form-locking, to the loaded printed-circuit board. This is advantageous because the plastic member may surround the printed-circuit board, and thus good mechanical protection may be ensured.

The plastic member may be assembled from at least two sub-members joined to each other with form locking, in particular, the form-locking joining being a latching. This offers an advantage that the sub-members may be prefabricated, and therefore may be able to be placed around the printed-circuit board and joined to each other. Thus, the printed-circuit board does not have to be loaded when placing the sub-members about the printed-circuit board.

The plastic member may be formed in one piece, in particular, may be produced as an overmold or as a plastic casting. An advantage in this case is that especially cost-effective production may be feasible, since the printed-circuit board may be introduced into a tool form and then may be overmolded or cast around.

The loaded printed-circuit board may have a lacquer on its surface, especially a water-vapor-repellent lacquer and/or a water-repellent lacquer. An advantage in this case is that the printed-circuit board may be surrounded in a tool form with small polystyrene balls and water vapor may be added, so that a cladding with polystyrene is producible in an easy manufacturing method. In this context, polystyrene is also to be understood as any other foamed plastic, especially which is thermally conductive and electrically insulating and preferably has a flame-protection additive.

The plastic may be realized as polystyrene or foamed plastic, especially as a polyurethane foam. This is advantageous in that a cost-effective material may be usable whose thermal conductivity may be improved by chemical additive constituents.

The plastic may have better thermal conductivity, particularly specific thermal conductivity, than air, in particular, the plastic member being made of electrically insulating material. An advantage in this context is that the thermal conductivity may be able to be improved by suitable additives. In addition, it is possible to dispense with air as a heat-transfer element, and the plastic member may be located directly between the printed-circuit board and the cooling plate.

The electrical device may be a converter, in particular, the signal electronics and the power electronics of the converter being disposed on the printed-circuit board. This is advantageous because only one printed-circuit board may need to be populated, thereby permitting highly automated production, since the insertion may be carried out by automatic insertion equipment. In addition, the electronic circuit, thus, including the printed-circuit board with connected cooling plate, may be joined to the housing in an especially simple and easy manner, since the electronic circuit may only need to be inserted into the cup-shaped housing.

A power module may be disposed on the printed-circuit board and may be joined to a cooling plate, especially a cooling plate containing aluminum, in particular, may be screwed onto this cooling plate and may be joined to it in thermally conductive manner for the dissipation of heat. An advantage in this connection is that upon assembly, the cooling plate may be connectable to the printed-circuit board via the power module. Consequently, a first side of the printed-circuit board, thus, the side of the printed-circuit board facing away from the cooling plate, may be able to be protected by the plastic member, and the other side of the printed-circuit board may be able to be protected not only by the remaining sub-member of the plastic member, but also by the cooling plate.

The cooling plate may be disposed outside of the plastic member, in particular, the power module protruding through an opening in the plastic member. This has an advantage that the dissipation of heat through the otherwise protective plastic member may not be impaired.

The plastic member may have openings for components, especially for large components, fitted on the printed-circuit board. This offers an advantage that in these areas, the heat may be able to be dissipated to the cooling plate by air or—as in the case of the power module—by way of a contact surface on the cooling plate.

The plastic member, particularly the second sub-member, may have a further opening which is an air connection between a heat-generating component fitted on the printed circuit board and a surface portion of the cooling plate, especially for the convective dissipation of heat with the aid of the air connection to the cooling plate. An advantage in this case is that with the aid of the plastic-member opening assigned to the specific heat-generating component and the associated surface area of the printed-circuit board, respectively, an air-space area may be produced which is bounded at least partially by a surface area of the cooling plate and by a specific heat-generating component or by the surface area on the printed-circuit board belonging to it. Thus, in response to temperature differences, a convectively impelled air flow may form, thereby permitting heat to be dissipated to the cooling plate.

A first side of the printed-circuit board or at least a partial area of this side may be, in particular, covered completely, thus, is covered over by the plastic member, especially by its first sub-member, and the other side of the printed-circuit board may be covered at least partially, thus, is covered over by the plastic member, especially by its second sub-member, in particular, the second sub-member being ring-shaped. This is advantageous because the covered-over components mounted on the printed-circuit board may be protected from environmental influences such as mechanical action of force, for example. Thus, the plastic member may fulfill housing-forming functions—to the extent the covering extends. At the same time, however, it may be more elastic than an aluminum housing. Only after insertion into the cup-shaped housing part and closure of the housing part by the cover part may a complete housing obtained. In this installed state, the plastic member then may also assume the heat-dissipating function or provide air-space areas for the specific dissipation of heat from heat-generating components, if its thermal conductivity is less than that of air.

The housing of the device may have a cup-shaped housing part which is closed by a cover part, in particular, a contact surface for the transfer of heat from the cooling plate to the housing being located on the inner wall of the cup-shaped housing part. This has an advantage that the heat transferred from the cooling plate to the housing may be able to be spread over the entire cup-shaped housing part. Consequently, the heat may be distributed over a large surface. In this context, however, the contact surface to the cooling plate should be brought into as good heat contact as possible. Since the cooling plate itself may already be implemented to be flat and large, especially comparable with the entire printed-circuit board, a sufficient heat transfer may easily be produced, especially even without heat-transfer compound in the contact area. The insertion of the cartridge, made up of the cooling plate, plastic member and printed-circuit board, into the cup-shaped housing also makes it possible to produce different variants in an easy manner. The reason is that the same cartridge may always able to be inserted into different housing parts. Thus, application-specific or market-specific special features are able to be covered by suitably modified housing parts. The cover part may be variable accordingly. Great variability may be able to be produced with a small number of structural components.

Cable lead-throughs, especially for electric supply lines, lines energizing a load and data-bus lines, may be disposed between the cover part and housing part. An advantage here is that the cup-shaped housing may be implemented with as deep a bottom as possible, thus, with high cup side walls.

Example embodiments of a method for producing an electrical device in which the device has a printed-circuit board fitted at least with a power module and further components, in particular, the components and the power module thus being secured on the printed-circuit board, may include:

(i) in one method step, enclosing the printed-circuit board at least partially by a plastic member, in particular
   overmolding at least partially with plastic to form the plastic member, or
   inserting between at least two sub-members of the at least two-piece plastic member, and after the insertion, joining the sub-members to each other, especially with form locking and/or by latching,
(ii) in a subsequent method step, connecting a cooling plate to the power module, in particular, via screw-connecting, and
(iii) in a further subsequent method step, inserting the printed-circuit board, together with the cooling plate and plastic member, into a cup-shaped housing part, and pressing the cooling plate against a contact surface on the inner wall of the housing part, in particular, via joining in heat-conducting manner.

This is advantageous because the printed-circuit board may be surrounded by a protective plastic member, and thus may be protected during transport and storage. After the joining of the cooling plate, the protection may be increased, and the electronic circuit may be transportable as a unit, especially a cartridge. For the final assembly, the cartridge may be inserted into the cup-shaped housing, and with its cooling plate, brought into contact in order to dissipate heat to the cup-shaped housing. The housing may be made of metal such as aluminum, for example, so that the heat may be dissipated well and a high mechanical stability may be employed in housing-forming fashion.

The present invention is not limited to the combination of features in the example embodiments described herein.

Further features and aspects of example embodiments of the present invention are explained in greater detail below with reference to the appended Figures.

DETAILED DESCRIPTION

Figure 1:
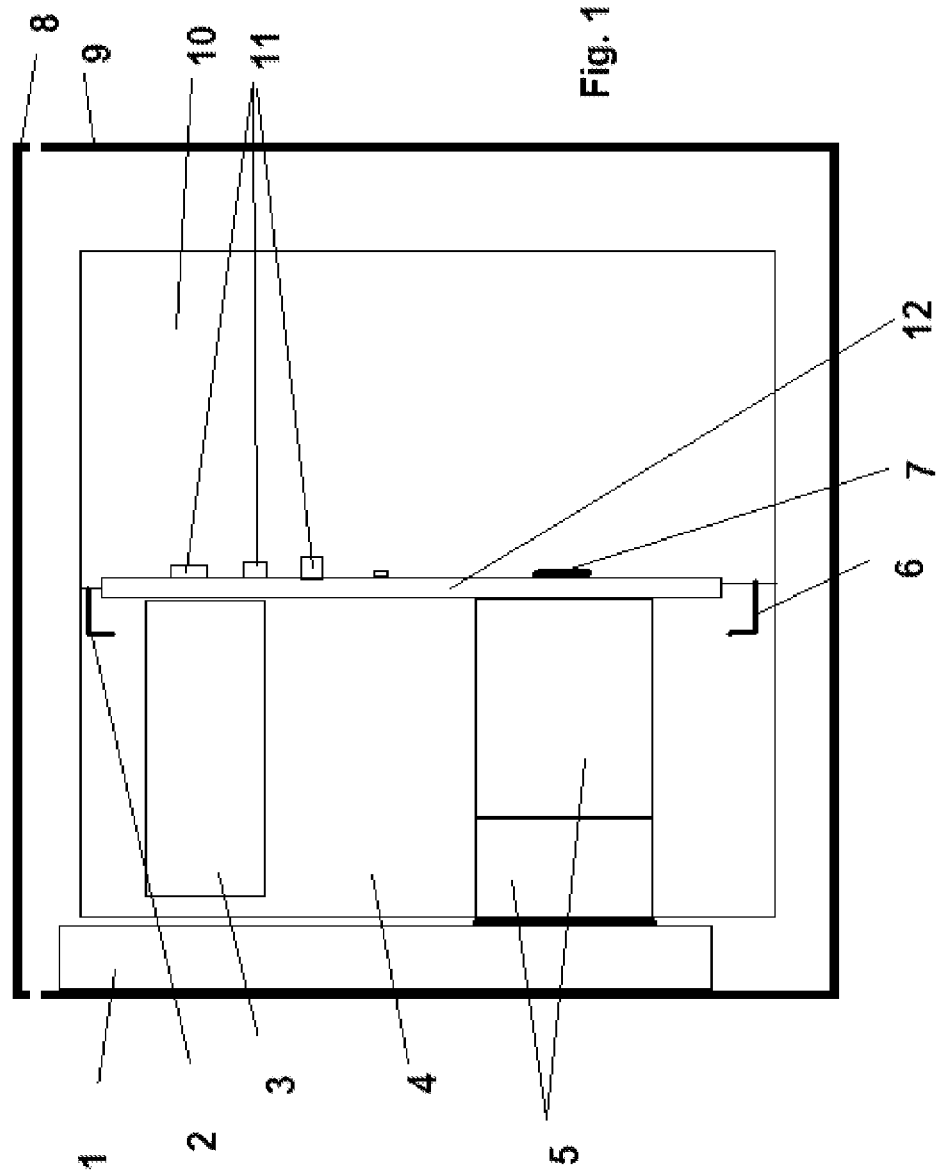
FIG. 1 schematically shows an example embodiment of a converter according to the present invention, having a plastic member formed of a first and a second foam-plastic part.

In FIGS. 3 through 10, the plastic member is removed in each case.

The housing of the converter has a cup-shaped housing part 9, preferably made in one piece of aluminum, that is closed by a cover part 8. In the intermediate area between cover part 8 and cup-shaped housing part 9, cable lead-throughs are provided, so that on one hand, power supply cables are able to be introduced into the interior, and on the other hand, connecting cables to the electric motor, thus the load, supplied by the converter are able to be brought out. In addition, data-bus cables are also routed through a cable lead-through located there, into the interior.

The electric motor is preferably a three-phase motor. The power-supply cables preferably carry single-phase or three-phase AC supply voltage.

A cartridge, which includes printed-circuit board 12 of the converter and a cooling plate 1, is inserted in the interior of the converter.

The entire electronic circuitry of the converter, thus, signal electronics and power electronics, is disposed on the printed-circuit board. The power electronics include at least:
   a rectifier which rectifies the AC voltage supplied by the power supply cables,
   an intermediate circuit capacitor to smooth the rectified voltage, and
   a power module, having power semiconductor switches disposed in half-bridges, from which the lines feeding the motor are supplied.

The signal electronics generate pulse-width modulated driving signals for the power semiconductor switches, and are connected to the data bus.

Printed-circuit board 12 is thus fitted with at least one large component 3 such as the intermediate circuit capacitor, and power module 5. In addition, printed-circuit board 12 is also fitted with small components 11, such as SMD-components.

Power module 5 is screwed onto a cooling plate 1 by a connecting screw having a screw head 7, so that the heat from the power module is able to be dissipated at the contact surface to cooling plate 1. Power module 5 has as contact surface, a contact surface which is ceramic-coated or covered with copper. Cooling plate 1 is made preferably of aluminum. Thus, a good heat-conducting contact may be produced and the heat is able to be dissipated effectively.

The cooling plate has a plate surface of more than 50%, especially more than 80% or 90% of the printed-circuit board surface. The heat may be spread even better if the plate surface of cooling plate 1 exceeds the surface of the printed-circuit board.

Thus, it is possible to spread the heat generated by the power module.

When introducing the cartridge into cup-shaped housing part 9, the cooling plate is pressed against the inner wall of the cup-shaped housing part, in particular, is pressed increasingly in response to the tightening of corresponding connecting screws which connect the cartridge to cup-shaped housing part 9. Thus, the heat is then transmitted from cooling plate 1 to cup-shaped housing part 9, and therefore spread.

In this context, it may be important that the cup-shaped housing part surround the cartridge with the exception of the cover-part area. Therefore, the printed-circuit board sits on both sides in this housing part 9 having approximately the same temperature thermally. The signal electronics and power electronics are thus at the same temperature level.

Printed-circuit board 12 is surrounded on both sides by foam-plastic parts, thus, is packed in, so to speak. A cooling plate 1 is disposed only on one side, so that only printed-circuit board 12, but not cooling plate 1, is packed in on both sides.

First foam-plastic part 10 is situated on the first side of the printed-circuit board. Second foam-plastic part 4 is situated on the other side, thus, between cooling plate 1 and printed-circuit board 12.

The two foam-plastic parts 4 and 10 are connectable by a latching. Thus, they embrace printed-circuit board 12, as it were.

Figure 2:
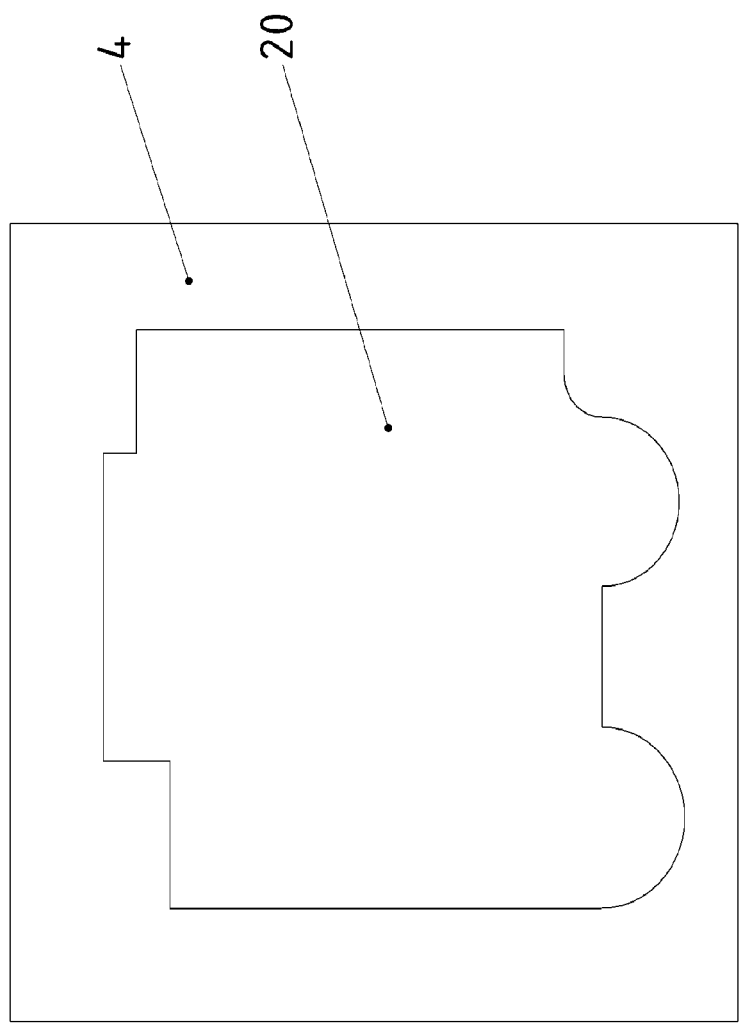
FIG. 2 schematically shows the contour of the opening in second foam-plastic part.

Second foam-plastic part 4 has openings for large components 3 and power module 5. Since for stability reasons, remaining segments should have a minimum wall thickness, in the event large components 3 and power module 5 are disposed tightly, instead of individual openings set apart from each other in foam-plastic part 4, a single large opening 20 results, as shown in FIG. 2. Consequently, the air in the intervening spaces between the large components and within second foam-plastic part 4 directs convective heat from hot to cold surface areas, thus, especially to cooling plate 1.

According to FIG. 2, second foam-plastic part 4 is formed as a ring-shaped structure.

Latching 2 and 6, respectively, of foam-plastic parts 4 and 10 is achieved by their formation, thus, is practicable without additional parts. In this context, a detent is formed on one of foam-plastic parts 4 or 10, and on the other, a corresponding opening with catch projection. By engaging the projection from behind, thus latching, a form-locking connection is able to be produced.

Foam-plastic parts 4 and 10 form a protection for the printed-circuit board against mechanical effects such as impulses and/or vibrations. Therefore, printed-circuit board 12 may be stored and transported safely in this packaging formed by foam-plastic parts 4 and 10.

In addition, differently formed cup-shaped housing parts 9 are connectable with the cartridge depending upon the application or customer requirement. In the same way, differently formed cover parts 8 are connectable. In this manner, converters may thus be produced with different outer appearance and correspondingly, different functionalities without having to implement the printed-circuit board differently each time. In this context, it may be important that the interface with respect to the cartridge is compatible; in particular, the interface with respect to the connection of cooling plate 1 to the inner wall of cup-shaped housing part 9 should be maintained.

Latching 2 and 6 is preferably releasable.

In a further example embodiment, the spacing of large components 3 from each other and from power module 5 is greater than in FIGS. 1 and 2. Consequently, the second foam-plastic part then has a plurality of openings, each of which is markedly smaller than the opening shown in FIG. 2. At the same time, however, openings are dimensioned and placed such that heat is extracted from hot heat sources by the convective air flows forming in the respective openings, to cooling plate 1. This formation of the openings as convectively operated air regions is especially advantageous when the thermal conductivity of the material for the foam-plastic parts is lower than that of air.

Air in the present invention is to be understood as the ambient air of the converter and/or air having a temperature of 20° C. at 1 bar pressure and a humidity of 30%.

If the thermal conductivity of the material for the foam-plastic parts exceeds that of air, the openings for convectively operated air regions are omitted to the greatest extent possible. Thus, only openings for large components 3 and power module 5 are then provided.

A polyurethane or perhaps polystyrene are usable as foamed plastic material.

In a further example embodiment, loaded printed-circuit board 12 is not joined mechanically to two foam-plastic parts, but rather, a foam-plastic part is produced by overmolding or when producing the polystyrene. In this case, the loaded printed-circuit board is lacquered with a lacquer impermeable to water or water vapor, e.g., as a dipping lacquer. In a further manufacturing step, printed-circuit board 12 thus lacquered is inserted into a tool form, and the remaining inside area of the form is then filled with small polystyrene balls. By additionally introducing hot water vapor, the small polystyrene balls are joined to each other with form locking, so that foam-plastic parts 4 and 10 are shaped in one piece and contain no additional openings for air or the like. In this context, the thermal conduction of the polystyrene obtained is improved by chemical additives such that it is better than that of air. Instead of the polystyrene, another material suitable for the overmolding, which is electrically insulating but with better thermal conductivity than air, may also be used. Depending upon the manufacturing process, the lacquering with water-repellent or water-vapor-repellent lacquer is then dispensable.

Preferably, heat-transfer compound is omitted in the contact area between the cooling plate and the housing part. The surface is sufficiently large for this, so that the heat is effectively spread accordingly.

Figure 3:
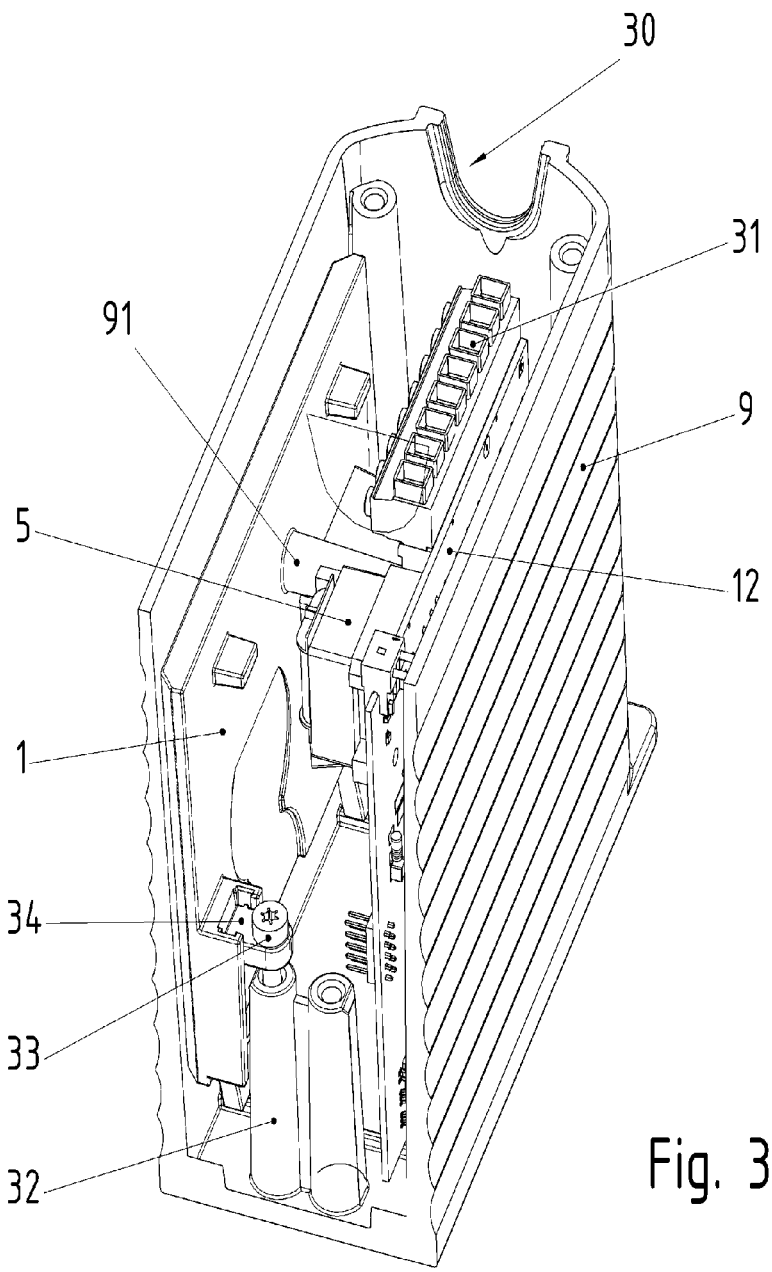
FIG. 3 shows an oblique, cut-away view of the example embodiment of the converter in a concrete representation, with cover part removed.

As shown in FIG. 3, at the upper edge area, thus, at the edge area facing cover part 8, an accommodation 30 is located for cable lead-through 60. The opening forming accommodation 30 is U-shaped. The opening therefore tapers downward, thus, in the direction toward the bottom of cup-shaped housing part 9. The inside diameter thus decreases monotonically in this direction. Consequently, an elastic cable lead-through 60 is usable which, upon placement of cover part 8, is pressed downward, and in the process, is elastically deformed. In this context, a cable passed through cable lead-through 60 is very effectively sealed.

Also disposed on printed-circuit board 12 are connecting elements 31 for electric lines, with which the electric supply lines routed through a cable lead-through 60 and the lines energizing the motor are compatible and connectable.

The input device and display device disposed in cover part 8 are connected electrically by a cable routed from cover part 8 to printed-circuit board 12, a connector part being disposed at the end of the cable which is able to be plugged into a mating connector part located on printed-circuit board 12. Alternatively, the connector part may also be placed on cover part 8 and plugged into the mating connector part.

Figure 7:
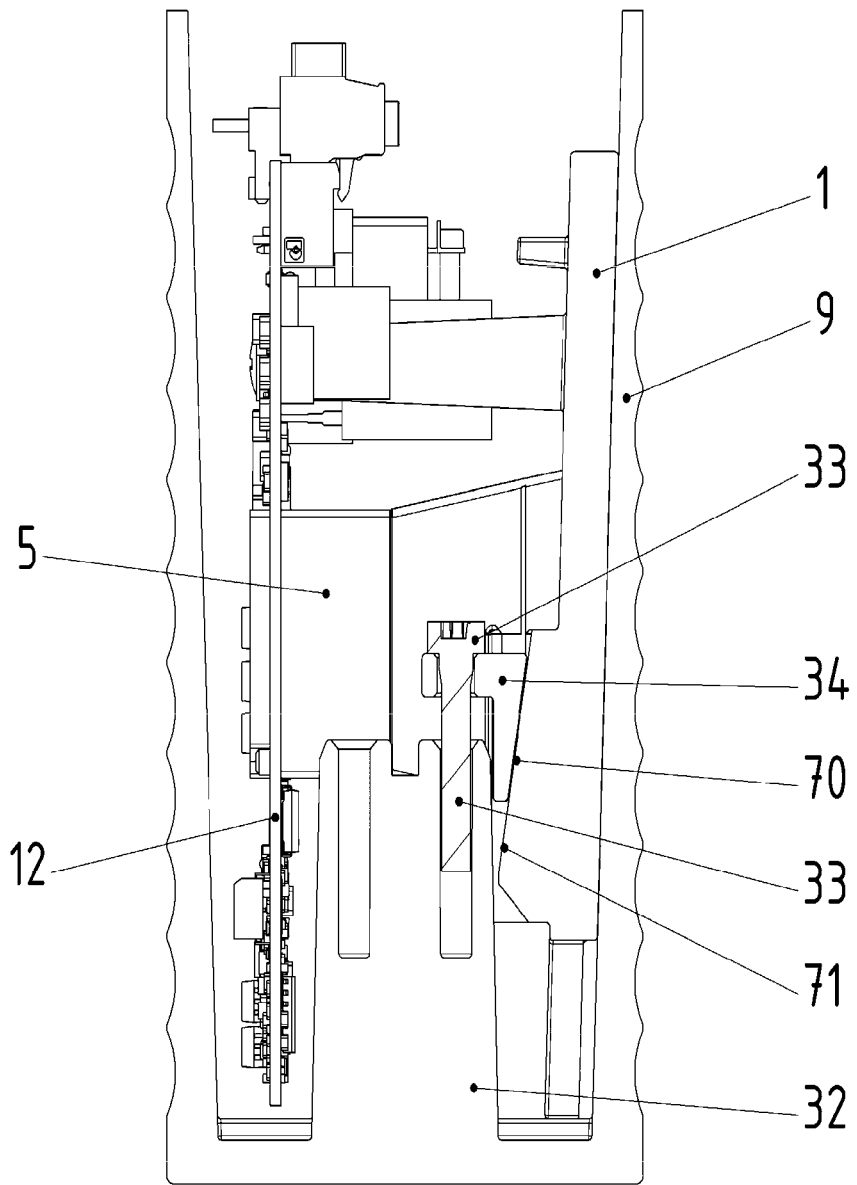
FIG. 7 shows a cross-sectional view through the converter with cover part removed.

FIGS. 3 and 7 also show a dome 32, formed at the bottom of cup-shaped housing part 9, into which screw 33 is able to be screwed into place. Upon screwing screw 33 into place, a wedge 34 is pressed downward by the head of screw 33. In so doing, wedge 34 is guided laterally in lateral guiding catches 51, each of which has a guide groove 50, running in the screw axis direction, for guiding wedge 34.

Wedge 34 has a hole through which screw 33 projects, and on whose boundary area, the screw head rests.

Guiding catches 51 are formed on cooling plate 1. Also formed on cooling plate 1 is a second sliding surface 71 which runs at an angle relative to the screwing direction and at an angle relative to the direction of surface normal of cooling plate 1, thus, with distance to the screw decreasing in the screwing direction. A correspondingly inclined first sliding surface 70 is located on wedge 34, so that when screwing screw 33 into dome 32, cooling plate 1 is pushed away from dome 32. In this way, cooling plate 1 is pressed with its contact surface against a corresponding contact surface on the inner wall of cup-shaped housing part 9, which is located on the side of cooling plate 1 facing away from the screw.

Figure 4:
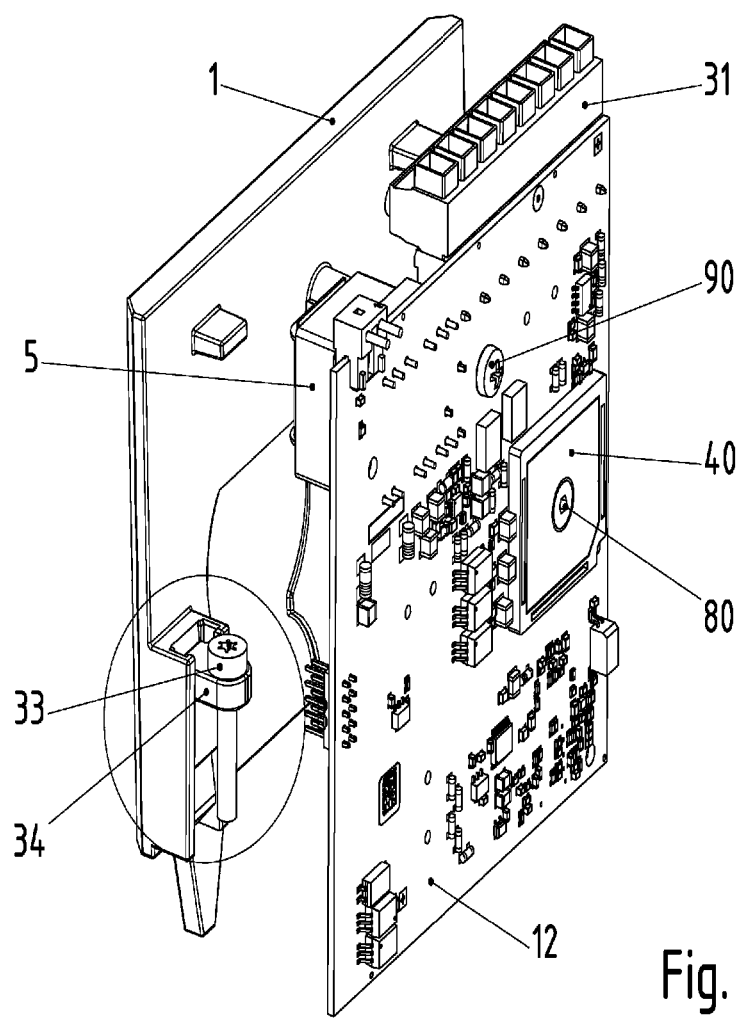
FIG. 4 shows an oblique view of the cartridge, made up of printed-circuit board and cooling plate, which is disposed in the interior of the converter.
Figure 5:
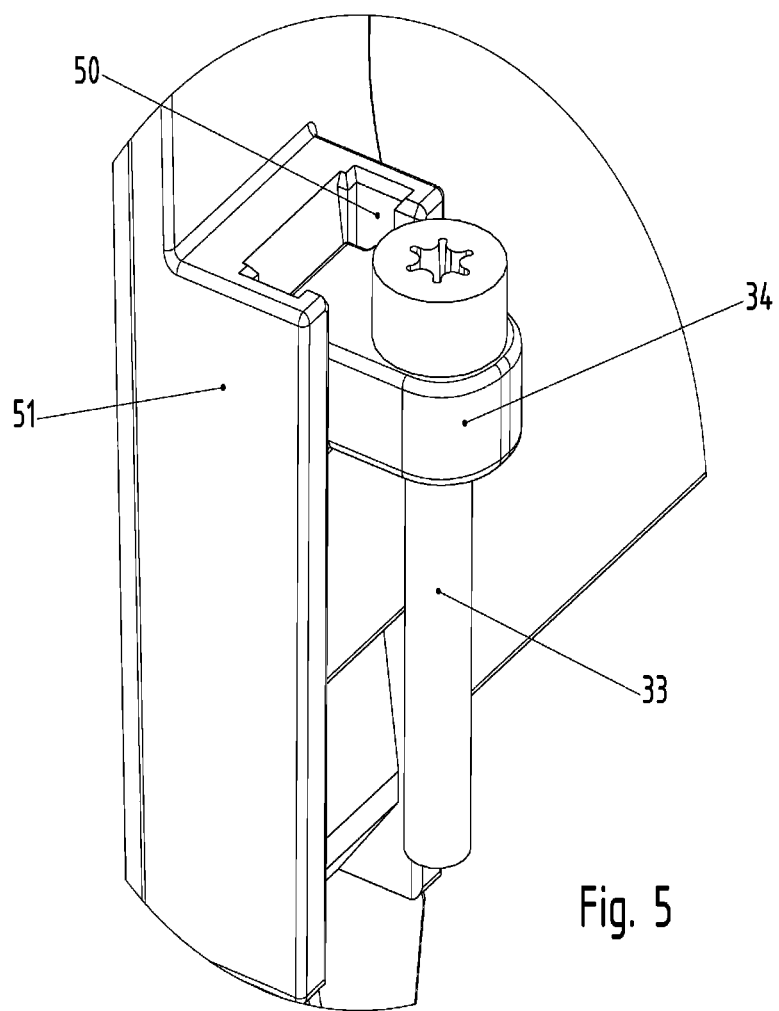
FIG. 5 shows an enlarged view of the circled section of FIG. 4.
Figure 6:
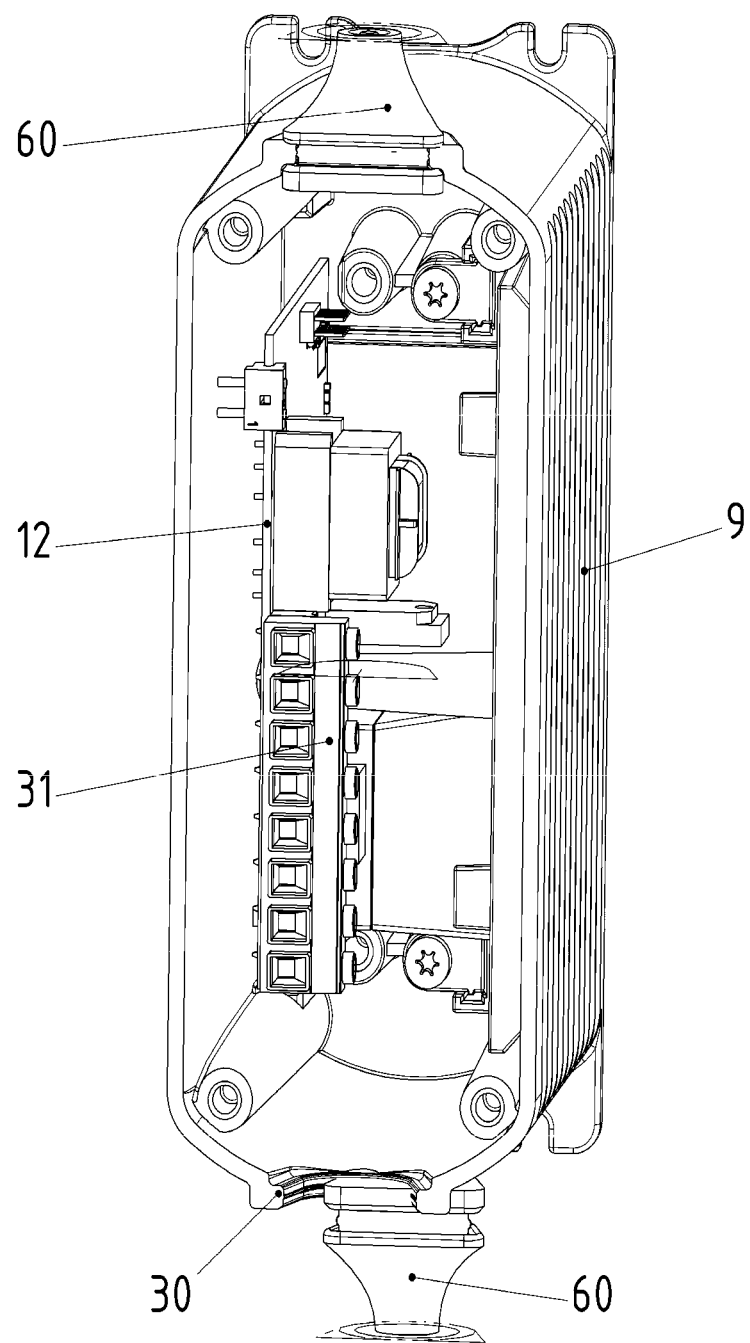
FIG. 6 shows an oblique view of the converter with cover part removed.

As shown in FIG. 4, power module 5 has a contact surface 40 for dissipating heat to cooling plate 1. The contact surface has good thermal conductivity and therefore preferably takes the form of a copper or ceramic contact surface.

Figure 8:
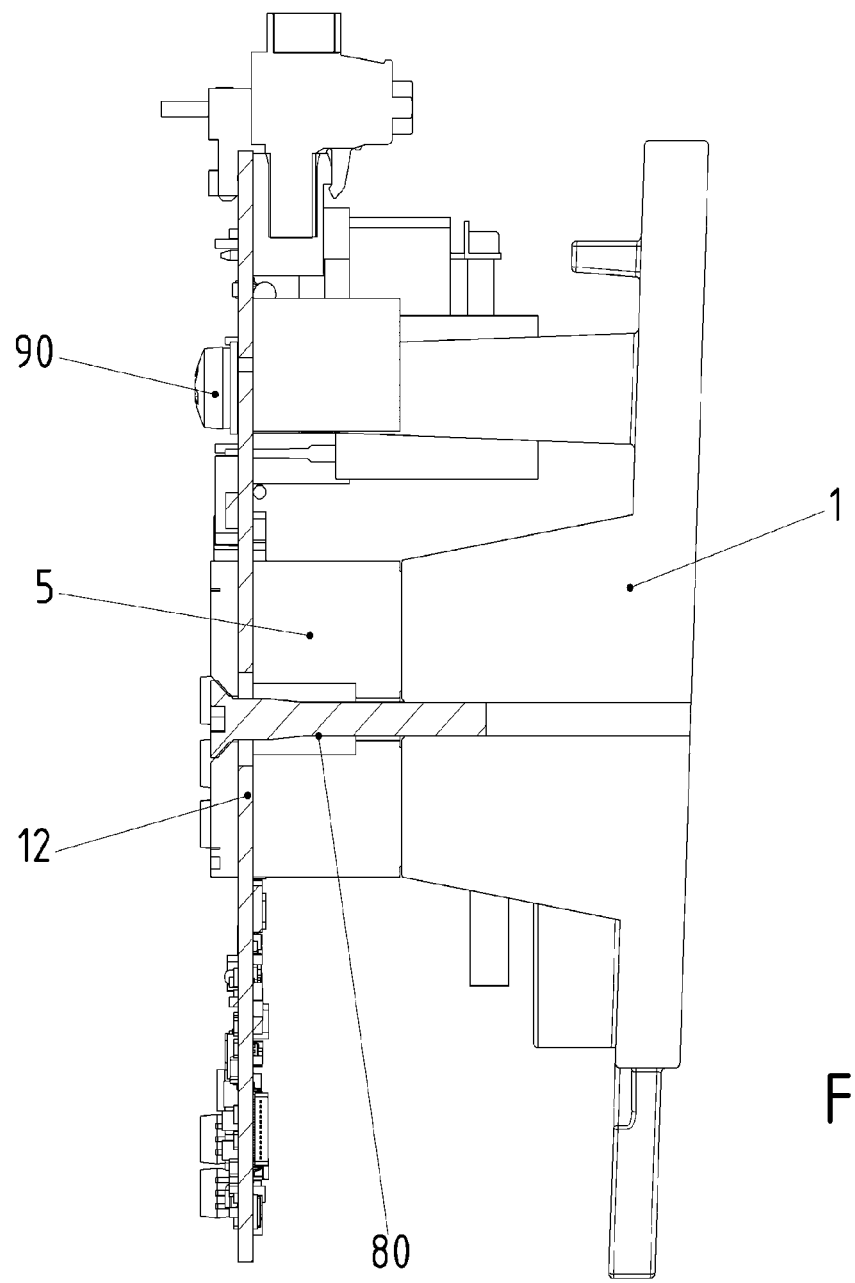
FIG. 8 shows a cross-sectional view through the cartridge.

As shown in FIG. 8, the printed-circuit board is connected to cooling plate 1 by a connecting screw 80, connecting screw 80 being guided centrally through power module 5 and pressing it with its contact surface 40 against the cooling plate. In so doing, the screw head of the connecting screw presses, via a plate-shaped intermediate part, on the side of printed-circuit board 12 facing away from cooling plate 1, and thus holds printed-circuit board 12 and the cooling plate together. The distance between printed-circuit board 12 and the cooling plate is defined by the power module, which thus also acts as spacing element.

Figure 9:
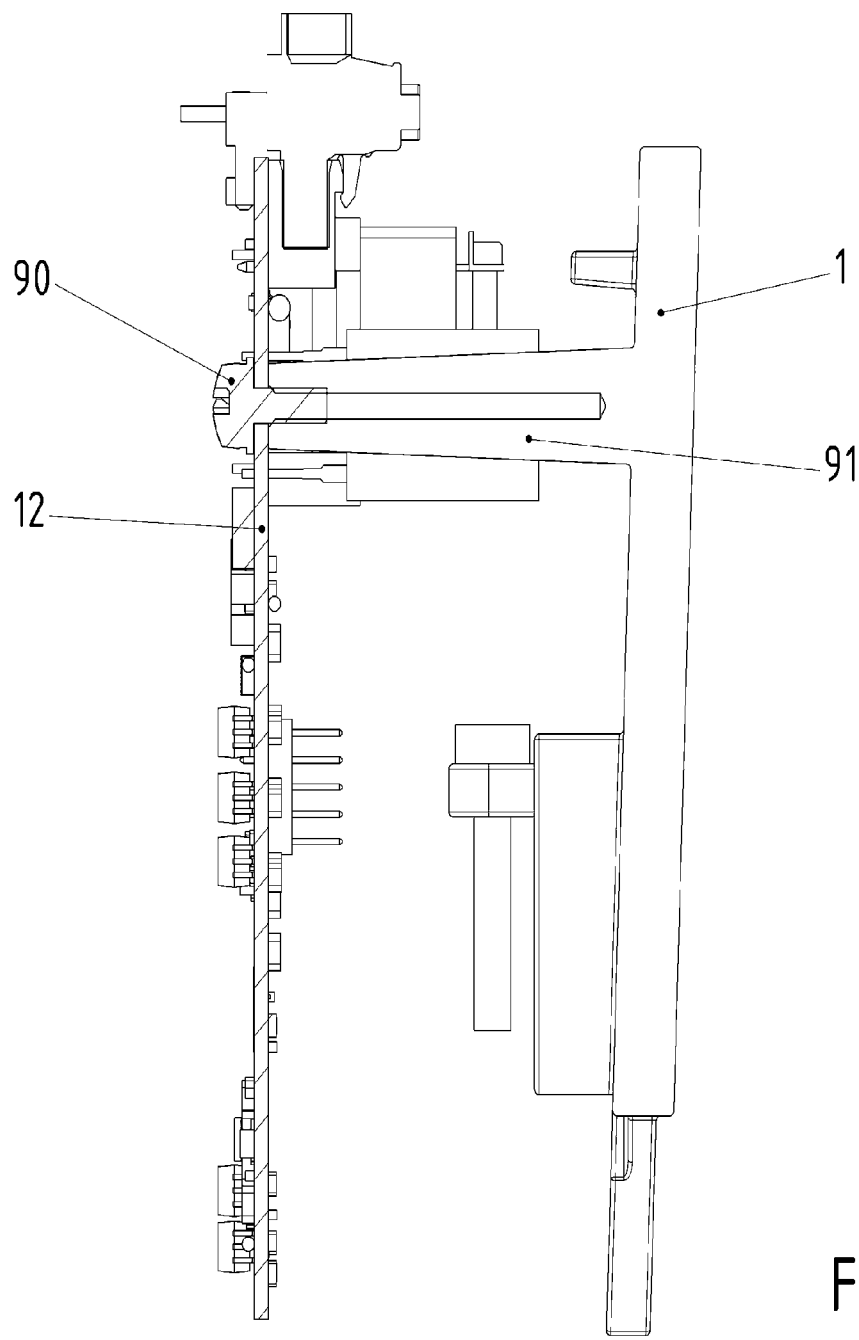
FIG. 9 shows another cross-sectional view through the cartridge.
Figure 10:
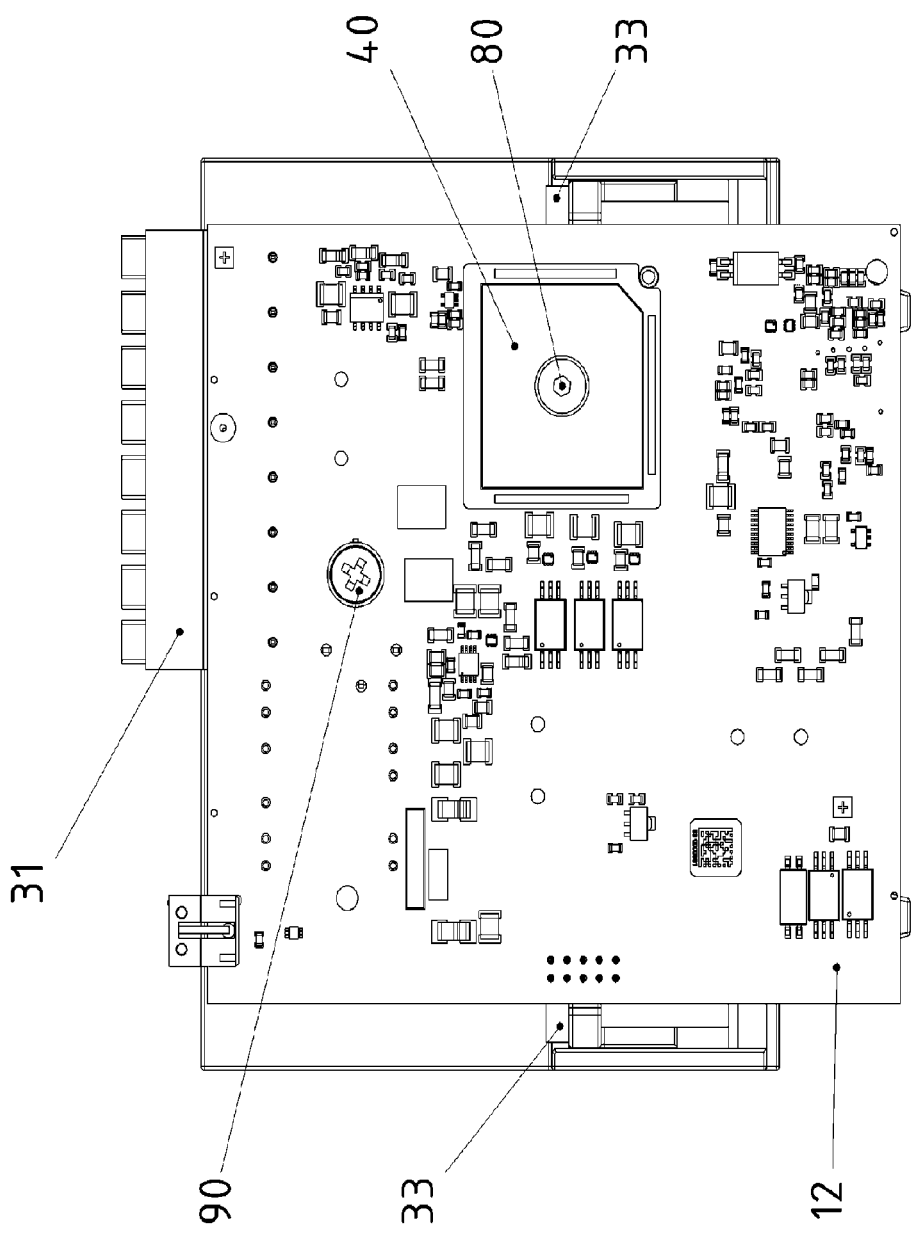
FIG. 10 shows a lateral view of the cartridge.

As shown in FIG. 9, a further connecting screw 90 is likewise disposed on the printed-circuit board, whose screw head presses directly on the side of the printed-circuit board facing away from cooling plate 1. Connecting screw 90 is screwed into a fastening dome 91 formed on the cooling plate. In this manner, printed-circuit board 12 is screwed onto cooling plate 1.

In a further example embodiment, guiding catches 51 are implemented as a separate part and joined appropriately to cooling plate 1.

In another example embodiment, fastening dome 91 is likewise implemented as a separate part and joined appropriately to cooling plate 1.

LIST OF REFERENCE NUMERALS

1 Cooling plate
2 Latching
3 Large component, especially capacitor
4 Second foam-plastic part
5 Power module, having power semiconductor switches
6 Latching
7 Screw head of a connecting screw for screwing the power module onto cooling plate 1
8 Cover part
9 Cup-shaped housing part
10 First foam-plastic part
11 SMD-components or small electronic components
12 Printed-circuit board
30 Accommodation for cable lead-through
31 Connecting elements
32 Dome, formed in one piece at the bottom of cup-shaped housing part 9
33 Screw
34 Wedge
40 Contact surface for heat dissipation, especially copper or ceramic contact surface
50 Guide groove for guiding wedge 34
51 Lateral guiding catch
60 Cable lead-through in accommodation 30
70 First sliding surface
71 Second sliding surface
80 Connecting screw
90 Connecting screw
91 Fastening dome for PE screw, thus grounding

What is claimed is:

1. An electrical device, comprising:
a printed-circuit board which is fitted with heat-generating components, the printed-circuit board being disposed in a housing of the device, the housing having a housing part or a cup-shaped housing part; and
a cooling plate connected to the printed-circuit board, the cooling plate being pressed against an inner wall of the housing part by a wedge such that heat from at least one heat-generating component, or a power module having power semiconductor switches, is able to be dissipated at a contact surface to the housing part, wherein the wedge is supported against a section of the housing part extending into an interior area of the device surrounded by the housing part.

2. The device according to claim 1, wherein the section is a fastening dome.

3. The device according to claim 1, further comprising a screw screwed into an opening or a tapped hole of the section such that upon being screwed in, the screw or its screw head presses on the wedge, thereby directing a pressure force onto the cooling plate via an inclined surface of the wedge, or a surface having an angle between 0° and 90° relative to a screw axis direction.

4. The device according to claim 3, wherein the section has a guideway for the wedge, the guideway having at least one guide groove which is aligned parallel to the screw axis direction.

5. The device according to claim 3, wherein the wedge has an opening, a round hole or a round bore through which the screw protrudes.

6. The device according to claim 1, further comprising:
a plastic member at least partially surrounding the printed-circuit board and joined, via material locking and/or form locking, to the loaded printed-circuit board; and/or
a plastic member disposed on both sides of the printed-circuit board and joined, via material locking and/or form locking, to the loaded printed-circuit board.

7. The device according to claim 6, wherein the plastic member is assembled from at least two sub-members joined to each other with form locking or a latching, or
wherein the plastic member is formed in one piece, as an overmold or as a plastic casting.

8. An electrical device, comprising:
a printed-circuit board which is fitted with heat-generating components, the printed-circuit board being disposed in a housing of the device, the housing having a housing part or a cup-shaped housing part; and
a cooling plate connected to the printed-circuit board, the cooling plate being pressed against an inner wall of the housing part by a wedge such that heat from at least one heat-generating component, or a power module having power semiconductor switches, is able to be dissipated at a contact surface to the housing part, the electrical device further comprising:
a plastic member at least partially surrounding the printed-circuit board and joined, via material locking and/or form locking, to the loaded printed-circuit board; and/or
a plastic member disposed on both sides of the printed-circuit board and joined, via material locking and/or form locking, to the loaded printed-circuit board,
wherein the loaded printed-circuit board has a lacquer, a water-vapor-repellent lacquer and/or a water-repellent lacquer on its surface; and/or
wherein the plastic member is made of polystyrene, foamed plastic, or a polyurethane foam; and/or
wherein the plastic member has better thermal conductivity or better specific thermal conductivity than air; and
wherein the plastic member is made of electrically insulating material.

9. The device according to claim 1, wherein the electrical device is a converter, signal electronics and power electronics of the converter being disposed on the printed-circuit board.

10. An electrical device, comprising:
a printed-circuit board which is fitted with heat-generating components, the printed-circuit board being disposed in a housing of the device, the housing having a housing part or a cup-shaped housing part; and
a cooling plate connected to the printed-circuit board, the cooling plate being pressed against an inner wall of the housing part by a wedge such that heat from at least one heat-generating component, or a power module having power semiconductor switches, is able to be dissipated at a contact surface to the housing part, wherein the cooling plate is set apart from the printed-circuit board by one of the heat-generating components or the power module, the printed-circuit board and the cooling plate are screw-connected, and the cooling plate contains aluminum.

11. The device according to claim 6, wherein the cooling plate is disposed outside of the plastic member, or the power module protrudes through an opening in the plastic member; and/or
  wherein the plastic member has openings for components or large components fitted on the printed-circuit board; and/or
  wherein the plastic member or a second sub-member of the plastic member has a further opening which is an air connection between a heat-generating component fitted on the printed-circuit board and a surface portion of the cooling plate, which is adapted for convective dissipation of heat with aid of the air connection to the cooling plate; and/or
  wherein the plastic member has a further opening for a component or a large component fitted on the printed-circuit board; and/or
  wherein a first side of the printed-circuit board or at least a partial area of the first side is covered or completely covered by the plastic member or by a first sub-member of the plastic member, and a second side of the printed-circuit board is covered at least partially by the plastic member or by the second sub-member, the second sub-member being ring-shaped; and/or
  wherein the housing of the device has a cup-shaped housing part which is closed by a cover part, a contact surface for transfer of heat from the cooling plate to the housing being located on the inner wall of the cup-shaped housing part; and/or
  wherein cable lead-throughs for electric power lines, lines energizing a load or data-bus lines are disposed between the cover part and the housing part.

12. A method for manufacturing an electrical device including a printed-circuit board fitted at least with a power module and components, the power module and the components being secured on the printed-circuit board, the method comprising:
  enclosing the printed-circuit board at least partially by a plastic member by overmolding the printed-circuit board at least partially with plastic to form the plastic member, or by inserting the printed-circuit board between at least two sub-members of the plastic member, the sub-members being joined to each other after the insertion via form locking and/or latching;
  connecting or screw-connecting a cooling plate to the power module;
  inserting the printed-circuit board, the cooling plate and the plastic member into a cup-shaped housing part; and
  pressing the cooling plate against a contact surface on an inner wall of the housing part, thereby joining in heat-conducting manner by a wedge which presses the cooling plate increasingly against the inner wall of the cup-shaped housing part as a screw is tightened, wherein the wedge is supported against a section of the housing part extending into an interior area of the device surrounded by the housing part.

* * * * *